(12) United States Patent
Andreev et al.

(10) Patent No.: US 7,003,510 B2
(45) Date of Patent: Feb. 21, 2006

(54) TABLE MODULE COMPILER EQUIVALENT TO ROM

(75) Inventors: Alexander E. Andreev, San Jose, CA (US); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 363 days.

(21) Appl. No.: 10/177,591

(22) Filed: Jun. 19, 2002

(65) Prior Publication Data

US 2003/0236774 A1 Dec. 25, 2003

(51) Int. Cl.
*H03K 19/20* (2006.01)
*G06F 17/50* (2006.01)
*G06F 17/30* (2006.01)

(52) U.S. Cl. .............................. 707/3; 716/1; 326/104

(58) Field of Classification Search ................ 707/1–4; 716/1–2; 326/104
See application file for complete search history.

(56) References Cited

U.S. PATENT DOCUMENTS 6,133,754 A * 10/2000 Olson ........................... 326/59
6,621,298 B1 * 9/2003 Agrawal et al. ............... 326/50
2003/0200510 A1 * 10/2003 Whitaker et al. ............... 716/1

OTHER PUBLICATIONS

U.S. Appl. No. 09/822,969, filed Mar. 30, 2001, Andreev et al.
U.S. Appl. No. 09/679,209, filed Oct. 4, 2000, Andreev et al.
U.S. Appl. No. 09/679,313, filed Oct. 4, 2000, Andreev et al.

* cited by examiner

*Primary Examiner*—Alford W. Kindred
(74) *Attorney, Agent, or Firm*—Fitch, Even, Tabin & Flannery

(57) ABSTRACT

A method of constructing a circuit for a Boolean function includes receiving as input a Boolean function of a number n of input variables wherein the number n of input variables may be varied over a range; generating at least two intermediate functions comprising sub-functions of the Boolean function wherein zero or one is substituted for all but two of the number n of input variables; and generating a selected output of the Boolean function of the number n of input variables from only two of the intermediate functions.

14 Claims, 2 Drawing Sheets

| INPUT | $X_2$ | $X_1$ | $X_0$ | $f_0$ | $f_1$ | $f_2$ |
|---|---|---|---|---|---|---|
| 0 | 0 | 0 | 0 | 1 | 1 | 0 |
| 1 | 0 | 0 | 1 | 0 | 0 | 1 |
| 2 | 0 | 1 | 0 | 0 | 0 | 0 |
| 3 | 0 | 1 | 1 | 0 | 1 | 0 |
| 4 | 1 | 0 | 0 | 0 | 1 | 1 |
| 5 | 1 | 0 | 1 | 1 | 0 | 1 |
| 6 | 1 | 1 | 0 | 0 | 0 | 0 |
| 7 | 1 | 1 | 1 | 0 | 0 | 0 |

| INPUT | $X_2$ | $X_1$ | $X_0$ | $f_0$ | $f_1$ | $f_2$ |
|---|---|---|---|---|---|---|
| 0 | 0 | 0 | 0 | 1 | 1 | 0 |
| 1 | 0 | 0 | 1 | 0 | 0 | 1 |
| 2 | 0 | 1 | 0 | 0 | 0 | 0 |
| 3 | 0 | 1 | 1 | 0 | 1 | 0 |
| 4 | 1 | 0 | 0 | 0 | 1 | 1 |
| 5 | 1 | 0 | 1 | 1 | 0 | 1 |
| 6 | 1 | 1 | 0 | 0 | 0 | 0 |
| 7 | 1 | 1 | 1 | 0 | 0 | 0 |
FIG._1
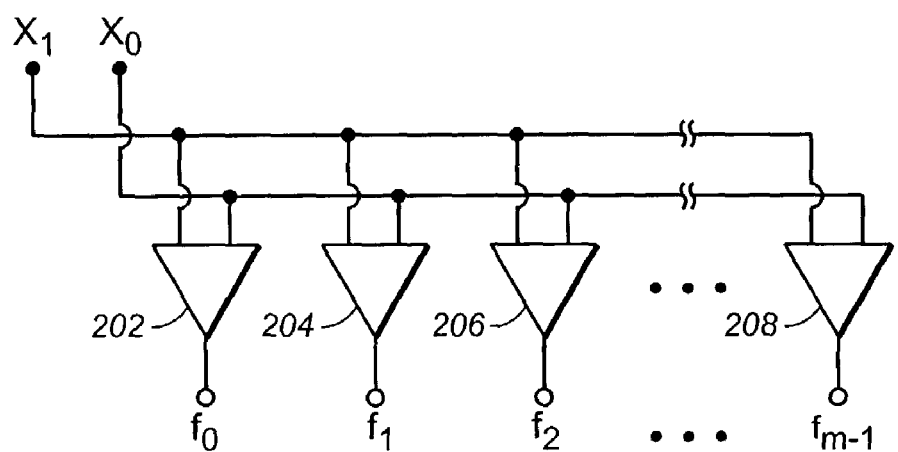
FIG._2

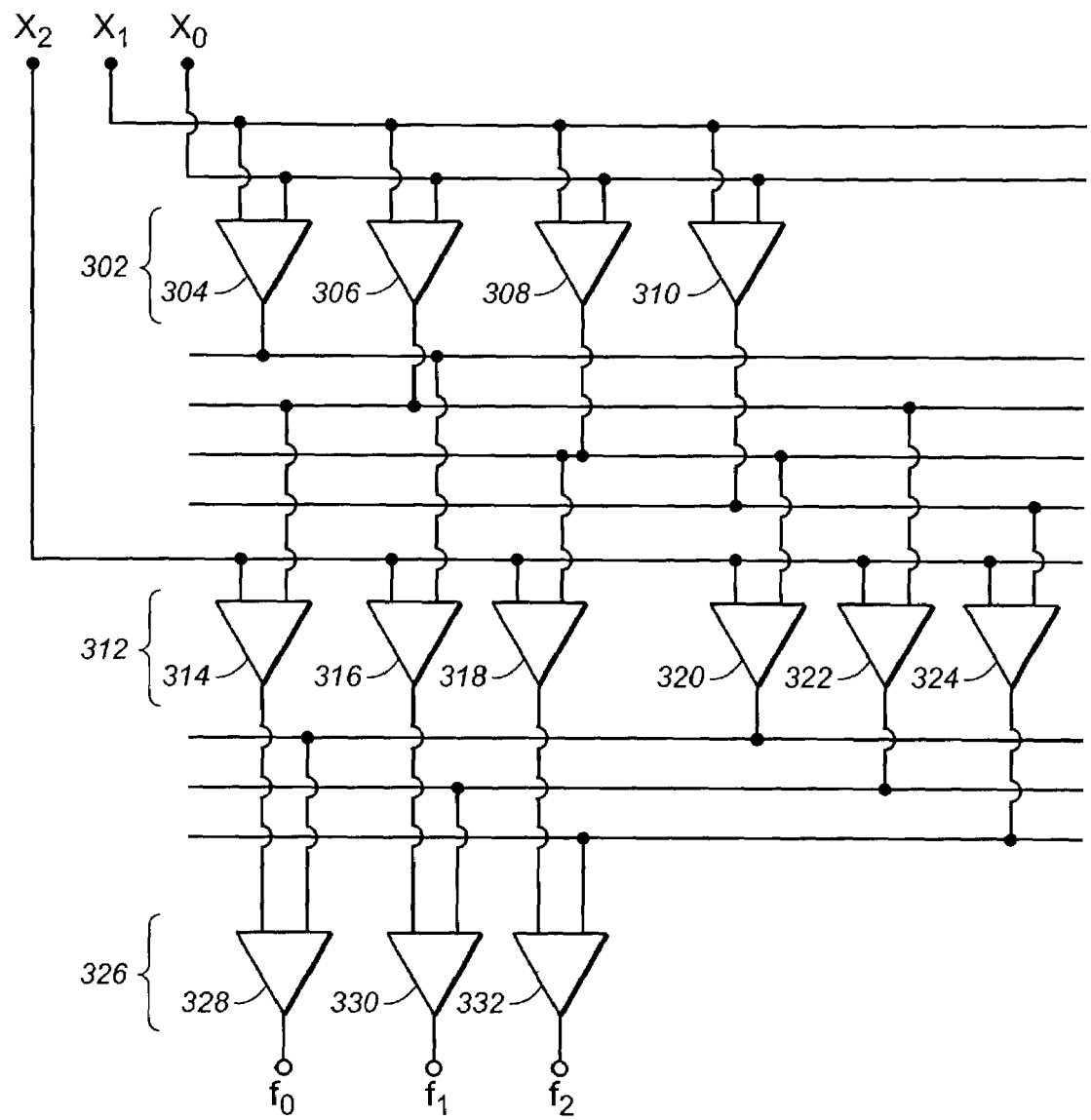
FIG._3

TABLE MODULE COMPILER EQUIVALENT TO ROM

CROSS REFERENCE TO RELATED APPLICATIONS

This application is related to U.S. patent application Ser. No. 09/679,209 by Andreev, et. al. for "FAST FLEXIBLE SEARCH ENGINE FOR LONGEST PREFIX MATCH" filed on Oct. 4, 2000, incorporated herein by reference and assigned to the same assignee as the present invention; and U.S. patent application Ser. No. 09/679,313 by Andreev, et al. for "FLEXIBLE SEARCH ENGINE HAVING SORTED BINARY SEARCH TREE FOR PERFECT MATCH", filed on Oct. 4, 2000, incorporated herein by reference and assigned to the same assignee as the present invention.

BACKGROUND OF THE INVENTION

The present invention is directed to methods for implementing function tables in integrated circuit designs. More specifically, but without limitation thereto, the present invention is directed to implementing a function table with random logic elements.

Designs often contain function tables, that is, tables of systems of Boolean operators, or functions, that are typically implemented in read-only memory (ROM). Examples of such tables may be found in U.S. patent application Ser. No. 09/679,209 by Andreev, et. al for "FAST FLEXIBLE SEARCH ENGINE FOR LONGEST PREFIX MATCH" filed on Oct. 4, 2000, and U.S. patent application Ser. No. 09/679,313 by Andreev, et al. for "FLEXIBLE SEARCH ENGINE HAVING SORTED BINARY SEARCH TREE FOR PERFECT MATCH", filed on Oct. 4, 2000. For small tables that have from about 30 to 1,000 entries, implementing function tables in ROM becomes expensive. This is because ROM compilers create overhead such decoders and I/O pins that are independent of the number of words and bits. This overhead is relatively small for tables having more than 16,000 entries, but becomes extremely large for small tables. Another disadvantage in using ROM for small tables is that the floorplan and design flow of an integrated circuit are complicated by the use of ROM, since ROM megacells are typically placed manually, creating blockages for placement and routing of random logic cells.

SUMMARY OF THE INVENTION

In one aspect of the present invention, a method of constructing a circuit for a Boolean function includes receiving as input a Boolean function of a number n of input variables wherein the number n of input variables may be varied over a range; generating at least two intermediate functions comprising sub-functions of the Boolean function wherein zero or one is substituted for all but two of the number n of input variables; and generating a selected output of the Boolean function of the number n of input variables from only two of the intermediate functions.

In one embodiment, the number n of input variables may be varied over a range from two to twenty.

In another embodiment, a method of constructing a circuit for a Boolean function includes instantiating a first layer of cells wherein each of the cells has only two inputs, and the two inputs are coupled respectively to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a, x_1, x_0)$ of the Boolean function and a equals zero or one; instantiating a second layer of cells wherein each of the cells has only two inputs, and the two inputs are coupled respectively to the i-th output of one of the sub-functions $fun_{2,u}(x_1, x_0)$ in the first layer and to a third input variable of the Boolean function to generate an AND-function of the third input variable and the i-th output; and instantiating a third layer of cells wherein each of the cells has only two inputs, and the two inputs are coupled respectively to two AND-functions generated by the cells in the second layer to generate an OR-function that is representative of the i-th output of the Boolean function of the number of input variables.

In still another embodiment, a method of constructing a circuit for a Boolean function includes instantiating a first layer of cells wherein each of the cells has only two inputs, and the two inputs are coupled respectively either to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a, b, x_1, x_0)$ of the Boolean function wherein {a, b} equals one of {0,0}, {0,1}, {1,0}, and {1,1} or to second and third input variables $x_2$ and $x_3$ of the Boolean function to generate sub-functions $K_{a,b}=fun_{2,1<<(2a+b)}(x_3, x_2)$; instantiating a second layer of cells wherein each of the cells has only two inputs, and the two inputs are coupled respectively to an i-th output of one of the sub-functions $fun_{2,u}(x_1, x_0)$ in the first layer and to one of the sub-functions $K_{a,b}=fun_{2,1<<(2a+b)}(x_3, x_2)$ in the first layer to generate an intermediate function $f_{2_{a,b,u}}$ for each of the cells in the second layer; instantiating a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein u0=u % 16 and u1=u>>4; and instantiating a fourth layer of cells wherein each of the cells has only two inputs, and the two inputs are coupled respectively to two intermediate functions $f_{3_{a,u2}}$ and $f_{3_{a,u3}}$ in the third layer to generate the i-th output of the Boolean function of the number of input variables wherein u2=u % 256 and u3=u>>8.

In yet another embodiment, a method of constructing a circuit for a Boolean function includes instantiating a first layer of cells wherein each of the cells has only two inputs, and the two inputs are coupled respectively either to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a_{n-1}, \ldots, a_2, x_1, x_0)$ of the Boolean function wherein $a_{n-1}, \ldots, a_2$ is a binary representation of each number in the range from zero to $2^{n-2}-1$, or to second and third input variables $x_2$ and $x_3$ of the Boolean function to generate sub-functions $K_{a_{n-1}, \ldots, a_2}=fun_{1,1<<(1-a_{n-1})}(x_3, x_2); \hat{}\ \ldots\ \hat{} fun_{1,1<<(1-a_4)}(x_3, x_2)$; instantiating a second layer of cells wherein each of the cells has only two inputs, and the two inputs are coupled respectively to an i-th output of one of the sub-functions $fun_{2,u}(x_1, x_0)$ in the first layer and to one of the sub-functions $K_{a_{n-1}, \ldots, a_2}$ in the first layer to generate an intermediate function $f_{2_{a,b,u}}$ for each of the cells in the second layer; instantiating a third layer of cells wherein each of the cells has only two inputs, and the two inputs are coupled respectively to two intermediate functions $f_{2_{a,b,u0}}$ and $f_{2_{a,u,1}}$ in the second layer to generate an intermediate function $f_{3_{a,u}}$ in the third layer wherein u0=u % 16 and u1=u>>4; instantiating a fourth layer of cells wherein each of the cells has only two inputs, and the two inputs are coupled respectively to two intermediate functions $f_{3_{a,u^2}}$ and $f_{3_{a,u^3}}$ in the third layer to generate each i-th output of an intermediate function $fun_{4,u}(x_3, x_2, x_1, x_0)$ wherein u2=u % 256 and u3=u>>8; instantiating a fifth layer of cells wherein each of the cells has only two inputs coupled respectively to an i-th output of a decoder function $fun_{1,1<<(1-a_{n-1})}(x_{n-1})\string^ \ldots \string^ fun_{1,1<<(1-a_0)}(x_0)$ wherein $a_{n-1}, \ldots, a_0$ is a binary representation of each number in the range from zero to $2^n-1$ and to the i-th output of a sub-function $fun_{4,u}(x_3, x_2, x_1, x_0)$ to generate an intermediate function $f_{4_u}$.

In another embodiment, the intermediate function $f_{4_u}$ corresponds to the i-th output of the Boolean function of the number of input variables.

In still another embodiment, a method of constructing a circuit for a Boolean function includes instantiating an additional layer of cells wherein each of the cells has only two inputs, and the two inputs are coupled respectively to two intermediate functions $f_{k_u}$ in the previous layer to generate each i-th output of an intermediate function $f_{k+1_u}$.

In yet another embodiment, the intermediate function $f_{k+1_u}$ corresponds to the i-th output of the Boolean function of the number of input variables.

DESCRIPTION OF THE DRAWINGS

The present invention is illustrated by way of example and not limitation in the accompanying figures, in which like references indicate similar elements throughout the several views of the drawings, and in which:

FIG. 1 illustrates an example of a table representative of a Boolean function of three input variables that may be compiled into random logic in accordance with an embodiment of the present invention;

FIG. 2 illustrates an example of the construction of a circuit for a Boolean function of two variables $f_i(x_1, x_0)$ in accordance with an embodiment of the present invention; and FIG. 3 illustrates a circuit for the Boolean table of FIG. 1 in accordance with an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

In one aspect of the present invention, a method of constructing a circuit for a Boolean function includes receiving as input a Boolean function of a number n of input variables wherein the number n of input variables may be varied over a range; generating at least two intermediate functions comprising sub-functions of the Boolean function wherein zero or one is substituted for all but two of the number n of input variables; and generating a selected output of the Boolean function of the number n of input variables from only two of the intermediate functions. The sub-functions of the Boolean function are compiled in an array of discrete, two-input logic cells. In contrast to ROM megacells, these standard logic cells may be placed and routed automatically using readily available floorplan design tools.

FIG. 1 illustrates an example of a table 100 representative of a Boolean function of three input variables that may be compiled into random logic in accordance with an embodiment of the present invention. In this example, there are three input variables of the Boolean function, namely, $X_0$, $X_1$, and $X_2$, and the outputs of the function are $f_0$, $f_1$, and $f_2$. For each set of values for inputs $X_0$, $X_1$, and $X_2$, there is a corresponding set of output values for $f_0$, $f_1$, and $f_2$ defined by the Boolean table 100. In general, a Boolean operator or function may be expressed as a (N,m)-table defined for a set of N input vectors, where each input vector is a binary representation of a number less than N, and m is the number of outputs $f_0, \ldots, f_{m-1}$. For example, a (32,3)-table has three outputs $f_0$, $f_1$, and $f_2$ for 32 input vectors 0000, 0001, . . . , 1111. The (N,m)-table may be expressed as the Boolean operator or function $(f_0(x_{n-1}, \ldots, x_0), \ldots, f_{m-1}(x_{n-1}, \ldots, x_0))$. Each input vector $x_{n-1}, \ldots, x_0$ is less than a number N, where n=uplog (N). The function uplog (x) is defined as the smallest integer not less than $\log_2(x)$. For the example of the (32,3)-table, n=uplog(N)=$\log_2$32=5. The Boolean operator, or function, corresponds to the binary table T[0.N-1][0.m-1] according to the formula:

$$T[i][j]=f_j(a_{n-1}, \ldots, a_0) \qquad (1)$$

where $(a_{n-1}, \ldots, a_0)$ is the input vector corresponding to the binary representation of the number i, that is, each of the terms $a_{n-1}, \ldots, a_0$ of the input vector equals zero or one, and j=0, . . . , m−1, where m is the number of outputs for each input vector. For example, the terms in the input vector corresponding to the binary representation of the number 13 are $a_3=1$, $a_2=1$, $a_1=0$, and $a_0=1$, and the output $f_1$ corresponding to the input vector 13 is represented by T[13][1]=$f_1(1,1,0,1)$.

In accordance with an embodiment of the present invention, a circuit is constructed for the operator $(f_0, \ldots, f_{m-1})$ from the binary table T in formula (1) received as the compiler input. The optimization goals are minimum circuit depth, or layers, and a minimum number of cells required to construct the circuit. The following examples illustrate the construction of circuits entirely of standard cells each having only two inputs for Boolean functions having a number n of input variables that may be varied for Boolean functions having up to one million input vectors.

For values of N<=4, the value of 4 may be used without loss of generality to illustrate the most complex case where none of the outputs are constants and n=2. If an output is a constant, it may be generated without a logic cell, thereby reducing the number of cells in the circuit. Also, the number of cells in the circuit is reduced as the total percentage of zeroes or ones in the outputs $f_1$ approaches the extremes of zero or 100 percent.

In the example of N=4, any function $f_i$ is a function of two variables as expressed by $f_i(x_1, x_0)$ and may be performed by a standard library two-input cell such as AND, OR, XOR, and so on.

FIG. 2 illustrates an example of the construction of a circuit for a Boolean function of two variables $f_i(x_1, x_0)$ in accordance with an embodiment of the present invention. Shown in FIG. 2 are inputs $x_1$ and $x_0$, two-input cells 202, 204, 206, and 208, and output functions $f_0$, $f_1$, $f_2$, and $f_{m-1}$. In this case, the circuit has a single layer of logic, or depth, of one.

In another embodiment, a method of constructing a circuit for a Boolean function includes instantiating a first layer of cells wherein each of the cells has only two inputs, and the two inputs are coupled respectively to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a, x_1, x_0)$ of the Boolean function and a equals zero or one; instantiating a second layer of cells wherein each of the cells has only two inputs, and the two inputs are coupled respectively to the i-th output of one of the sub-functions $fun_{2,u}(x_1, x_0)$ in the first layer and to a third input variable of the Boolean function to generate an AND-function of the third input variable and the i-th output; and instantiating a third layer of cells wherein each of the cells has only two inputs, and the two inputs are coupled respectively to two AND-functions generated by the cells in the second layer to generate an OR-function that is representative of the i-th output of the Boolean function of the number of input variables.

For values of N where $4<N<=8$, the value of 8 may be used without loss of generality to illustrate the most complex case where none of the outputs are constants and n=3. In the example of N=8, any function $f_i$ is a function of three variables as expressed by $f_i(x_2, x_1, x_0)$.

A Boolean function $f(x_2, x_1, x_0)$ may be represented by an integer function $tab(f)$ corresponding to the binary representation of the output vector. For example, in the table for the Boolean function in FIG. 1, the binary representation of the output vector $f_0$ is 00100001, and $tab(f_0)=21_{16}$. The value of f for any input vector $a_{n-1}, \ldots, a_0$ corresponding to the binary representation of the number i may be found by right shifting $tab(f)$ by i bits and masking out all but the least significant bit, as may be expressed by the formula:

$$f(a_{k-1}, \ldots, a_0) = (tab(f) >> i) \% 2 \quad (2)$$

In the example of table 100 in FIG. 1, $$f_0(1, 0, 1) = tab(f_0) >> 5 \% 2 \quad (3)$$
$$= 21_{16} >> 5 \% 2$$
$$= 1 \% 2$$
$$= 1$$

The function $fun_{k,i}$ is defined as a Boolean function according to the formula:

$$fun_{k,i} = f(x_{k-1}, \ldots, x_0) \quad (4)$$

such that $tab(f)=i$, where i is an integer representative of the output vector. For example, the function $fun_{2,1}(x_1, x_0)$ has the outputs $f(0,0)=1, f(0,1)=0, f(1,0)=0$, and $f(1,1)=0$.

The function $g_{a,i}(x_1, x_0)$ is defined as the Boolean function $f_i(a, x_1, x_0)$ according to the formula:

$$g_{a,i}(x_1, x_0) = f_i(a, x_1, x_0) \quad (5)$$

where $i=0, 1, \ldots, m-1$ and a has a value of zero or one.

A set $G_a$ is defined as all the different numbers in the list generated by $tab(g_{a,i})$, where $i=0, 1, \ldots, m-1$. The numbers zero and seven may be excluded from the list, because these functions may be represented by a zero or a one without requiring logic cells. Each value of $tab(g_{a,i})$ corresponds to a sub-function $f_i(a, x_1, x_0)$. In the example of table 100 in FIG. 1, $G_0=\{1,9,2\}$ and $G_1=\{2,1,3\}$.

A set G is defined as the union of the sets $G_a$ by the formula:

$$G = G_0 \cup G_1 \quad (6)$$

The circuit for the Boolean function $f(x_{k-1}, \ldots, x_0)$ for $4<N<=8$ may be constructed as follows. A first layer of logic corresponds to the set G and contains cells that generate the intermediate functions $fun_{2,u}(x_1, x_0)$, where $u=tab(f_i)$ for each sub-function $f_i(a, x_1, x_0)$ of the set G. In the example of table 100 in FIG. 1, the set $G_0$ is $\{1, 9, 2\}$ and the set $G_1$ is $\{2, 1, 3\}$. The set G is therefore $\{1, 2, 3, 9\}$. Each two-input logic cell in the first layer of logic is accordingly selected to perform the intermediate functions $fun_{2,1}(x_1, x_0)$, $fun_{2,2}(x_1, x_0), fun_{2,3}(x_1, x_0)$, and $fun_{2,9}(x_1, x_0)$, respectively.

A second layer of logic contains two groups. The first group contains the two-input cells that generate the intermediate functions $\sim x_2 \,\hat{}\, fun_{2,u0}(x_1, x_0)$, where u0 is each sub-function $f_i(0,x_1, x_0)$ of the set $G_0$. In this example, the first group contains the cells that generate the intermediate functions $\sim x_2 \,\hat{}\, fun_{2,1}(x_1, x_0), \sim x_2 \,\hat{}\, fun_{2,9}(x_1, x_0)$, and $\sim x_2 \,\hat{}\, fun_{2,2}(x_1, x_0)$, respectively. The second group contains the cells that generate the intermediate functions $x_2 \,\hat{}\, fun_{2,u1}(x_1, x_0)$, where u1 is each sub-function $f_i(1,x_1, x_0)$ of the set $G_1$. In this example, the second group contains the cells that generate the intermediate functions $x_2 \,\hat{}\, fun_{2,2}(x_1, x_0), x_2 \,\hat{}\, fun_{2,1}(x_1, x_0)$, and $x_2 \,\hat{}\, fun_{2,3}(x_1, x_0)$, respectively.

A third layer of logic computes the Boolean operator according to the formula:

$$f_i(x_2, x_1, x_0) = (\sim x_2 \,\hat{}\, fun_{2,u0}(x_1, x_0))\,\hat{}\,(x_2 \,\hat{}\, fun_{2,u1}(x_1, x_0)) \quad (7)$$

where $u0=tab(f_i(0, x_1, x_0)), u1=tab(f_i(1, x_1, x_0))$, and $i=0, 1, \ldots, m-1$. In this example, the third layer contains the two-input cells that generate the Boolean function for the three input variables as follows:

$$f_0 = (\sim x_2 \wedge fun_{2,1}(x_1, x_0)) \vee (x_2 \wedge fun_{2,2}(x_1, x_0)) \quad (8)$$

$$f_1 = (\sim x_2 \wedge fun_{2,9}(x_1, x_0)) \vee (x_2 \wedge fun_{2,1}(x_1, x_0))$$

$$f_2 = (\sim x_2 \wedge fun_{2,2}(x_1, x_0)) \vee (x_2 \wedge fun_{2,3}(x_1, x_0))$$

The three layers of logic described above define a depth of three for this circuit.

FIG. 3 illustrates a circuit for the Boolean table of FIG. 1 in accordance with an embodiment of the present invention. Shown in FIG. 3 are input variables $x_2$, $x_1$, and $x_0$, a first logic layer 302, first layer cells 304, 306, 308, and 310, a second logic layer 312, second layer cells 314, 316, 318, 320, 322, and 324, a third logic layer 326, third layer logic cells 328, 330, and 332, and Boolean function outputs $f_0$, $f_1$, and $f_2$.

The first layer cells 304, 306, 308, and 310 generate the functions $fun_{2,1}(x_1, x_0), fun_{2,2}(x_1, x_0), fun_{2,3}(x_1, x_0)$, and $fun_{2,9}(x_1, x_0)$ described above for formula (6). The second layer cells 314, 316, and 318 generate the functions $\sim x_2 \,\hat{}\, fun_{2,1}(x_1, x_0), \sim x_2 \,\hat{}\, fun_{2,9}(x_1, x_0)$, and $\sim x_2 \,\hat{}\, fun_{2,2}(x_1, x_0)$, respectively. The second layer cells 320, 322, and 324 generate the functions $x_2 \,\hat{}\, fun_{2,2}(x_1, x_0), x_2 \,\hat{}\, fun_{2,1}(x_1, x_0)$, and $x_2 \,\hat{}\, fun_{2,3}(x_1, x_0)$, respectively. The third layer logic cells 328, 330, and 332 generate the functions $$f_0 = (\sim x_2 \wedge fun_{2,1}(x_1, x_0)) \vee (x_2 \wedge fun_{2,2}(x_1, x_0)),$$

$$f_1 = (\sim x_2 \wedge fun_{2,9}(x_1, x_0)) \vee (x_2 \wedge fun_{2,1}(x_1, x_0)), \text{ and}$$

$$f_2 = (\sim x_2 \wedge fun_{2,2}(x_1, x_0)) \vee (x_2 \wedge fun_{2,3}(x_1, x_0)), \text{ respectively.}$$

In still another embodiment, a method of constructing a circuit for a Boolean function includes instantiating a first layer of cells wherein each of the cells has only two inputs, and the two inputs are coupled respectively either to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a, b, x_1, x_0)$ of the Boolean function wherein {a, b} equals one of {0,0}, {0,1}, {1,0}, and {1,1} or to second and third input variables $x_2$ and $x_3$ of the Boolean function to generate sub-functions $K_{a,b}$=fun$_{2,1<<(2a+b)}(x_3, x_2)$; instantiating a second layer of cells wherein each of the cells has only two inputs, and the two inputs are coupled respectively to an i-th output of one of the sub-functions fun$_{2,u}(x_1, x_0)$ in the first layer and to one of the sub-functions $K_{a,b}$=fun$_{2,1<<(2a+b)}(x_3, x_2)$ in the first layer to generate an intermediate function $f_{2_{a,b,u}}$ for each of the cells in the second layer; instantiating a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein u0=u % 16 and u1=u>>4; and instantiating a fourth layer of cells wherein each of the cells has only two inputs, and the two inputs are coupled respectively to two intermediate functions $f_{3_{a,u2}}$ and $f_{3_{a,u3}}$ in the third layer to generate the i-th output of the Boolean function of the number of input variables wherein u2=u % 256 and u3=u>>8.

For values of N where 8<N<=16, the value of 16 may be used without loss of generality to illustrate the most complex case where none of the output functions are constants and n=4.

A set $F_i$ is defined as all the different numbers in the list generated by tab($f_i$) except the constants zero and fifteen, which do not require logic cells, where i=0, 1, . . . , m−1.

A set $F_{a,i}$ is defined as all the different numbers in the list generated by tab($f_i(a, x_2, x_1, x_0)$ except the constants zero and fifteen, where i=0, 1, . . . , m−1 and a equals zero or one.

A set $F_{a,b}$ is defined as all the different numbers in the list generated by tab($f_i(a, b, x_2, x_1, x_0)$ except the constants zero and fifteen, where i=0, 1, . . . , m−1, a equals zero or one, and b equals zero or one.

A set G is defined as the union of the sets $F_{a,b}$ according to the formula:

$$G = F_{0,0} \cup F_{0,1} \cup F_{1,0} \cup F_{1,1} \tag{9}$$

The circuit for the Boolean function $f(x_{k-1}, \ldots, x_0)$ for 8<N<=16 may be constructed as follows. A first layer of logic includes the intermediate functions fun$_{2,u}(x_1, x_0)$, where u is each sub-function from the set $G_i$. The first layer of logic also includes the intermediate functions $K_{a,b}$ defined by the formula:

$$K_{a,b} = fun_{2,1<<(2a+b)}(x_3, x_2) \tag{10}$$

where a equals zero or one and b equals zero or one. Equivalently, $K_{a,b}$ may be expressed by the formula:

$$K_{a,b} = fun_{1,1<<1-a}(x_3) \hat{} fun_{1,1<<1-b}(x_2) \tag{11}$$

where $$fun_{1,1<<0}(x) = \sim x \tag{12}$$

$$fun_{1,1<<1}(x) = x \tag{13}$$

A second layer of logic contains the intermediate functions defined by the formula:

$$f_{2_{a,b,u}} = K_{a,b} \hat{} fun_{2,u}(x_1, x_0) \tag{14}$$

for each pair (a,b) where u is each sub-function of the set $F_{a,b}$.

A third layer of logic includes the intermediate functions $f_{3_{a,u,i}}$, where u is each sub-function from the set $F_a$ and a equals zero or one. Each third layer function is the result of an OR function of two second layer functions according to the formula:

$$f_{3_{a,u}} = f_{2_{a,0,u0}} \hat{} f_{2_{a,1,u1}} \tag{15}$$

where u0=u % 16 and u1=u>>4.

A fourth layer contains the outputs of the Boolean operator ($f_0, \ldots, f_{m-1}$). Each function in the fourth layer is the result of an OR function of two functions in the third layer according to the formula:

$$f_i(x_3, x_2, x_1, x_0) = fun_{4,u} = f_{3_{0,u0}} \hat{} f_{3_{1,u1}} \tag{16}$$

where u=tab($f_i$), u0=u % 256, and u1=u>>8. The four layers of logic define a depth of four for this circuit.

In yet another embodiment, a method of constructing a circuit for a Boolean function includes instantiating a first layer of cells wherein each of the cells has only two inputs, and the two inputs are coupled respectively either to first and second input variables $x_0$ and $x_1$ of the Boolean function to generate sub-functions fun$_{2,u}(x_1, x_0)$ each having an output vector equal to u wherein u is an integer corresponding to a binary representation of an i-th output $f_i(a_{n-1}, \ldots, a_2, x_1, x_0)$ of the Boolean function wherein an $a_{n-1}, \ldots, a_2$ is a binary representation of each number in the range from zero to $2^{n-2}-1$, or to second and third input variables $x_2$ and $x_3$ of the Boolean function to generate sub-functions $K_{a_{n-1}, \ldots, a_2}$= fun$_{1,1<<(1-a_{n-1})}(x_3, x_2) \hat{} \ldots \hat{} fun_{1,1<<(1-a_4)}(x_3, x_2)$; instantiating a second layer of cells wherein each of the cells has only two inputs, and the two inputs are coupled respectively to an i-th output of one of the sub-functions fun$_{2,u}(x_1, x_0)$ in the first layer and to one of the sub-functions $K_{a_{n-1}, \ldots, a_2}$ in the first layer to generate an intermediate function $f_{2_{a,b,u}}$ for each of the cells in the second layer; instantiating a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein u0=u % 16 and u1=u>>4; instantiating a fourth layer of cells wherein each of the cells has only two inputs, and the two inputs are coupled respectively to two intermediate functions $f_{3_{a,u2}}$ and $f_{3_{a,u3}}$ in the third layer to generate each i-th output of an intermediate function fun$_{4,u}(x_3, x_2, x_1, x_0)$ wherein u2=u % 256 and u3=u>>8; instantiating a fifth layer of cells wherein each of the cells has only two inputs coupled respectively to an i-th output of a decoder function fun$_{1,1<<(1-a_{n-1})}(x_{n-1}) \hat{} \ldots \hat{} fun_{1,1<<(1-a_0)}(x_0)$ wherein $a_{n-1}, \ldots, a_0$ is a binary representation of each number in the range from zero to $2^n-1$ and to the i-th output of a sub-function fun$_{4,u}(x_3, x_2, x_1, x_0)$ to generate an intermediate function $f_{4_u}$.

A decoder D($x_{n-1}, \ldots, x_0$) is a Boolean operator that realizes the following system of functions:

$$fun_{1,1<<a_{n-1}} \hat{} fun_{1,1<<a_{n-2}} \hat{} \ldots \hat{} fun_{1,1<<a_0} \tag{17}$$

where the input vectors ($x_{n-1}, \ldots, x_0$) are all combinations of each of the terms $a_{n-1}, \ldots, a_0$ where each term equals zero or one. To implement the decoder D($x_{n-1}, \ldots, x_0$), two sub-decoders, D($x_{n-1}, \ldots, x_k$) and D($x_{k-1}, \ldots, x_0$) may be constructed, where k=n/2. Any function of the decoder D($x_{n-1}, \ldots, x_0$) may be expressed as the result of an AND function of the first and second sub-decoders D($x_{n-1}, \ldots, x_k$) and D($x_{k-1}, \ldots, x_0$). Consequently, the depth of the decoder is given by the formula:

$$depth(n) \leq 1 + max(depth(n-k), depth(k)) \tag{18}$$

where depth(n) is the minimum possible depth of the decoder D $(x_{n-1}, \ldots, x_0)$. Using the recursive construction described above, the depth of the decoder $D(x_{n-1}, \ldots, x_0)$ is given by the formula:

$$\text{depth}(N) = \text{uplog}(N) \qquad (19)$$

where N is the number of input vectors. In this example, the depth is depth(16)=uplog(16)=4. For example, a 2-input input decoder may be realized by $K_{a,b}$ as described above with reference to formula (11).

For values of N where 16<N<=1M, a set F is defined that contains all the different numbers in the list generated by tab($f_i$) except the constants zero and (N−1), where i=0, 1, ..., m−1.

A set $F_{a_{n-1}, \ldots, a_4}$ is defined that contains all the different numbers in the list generated by tab($f_i(a_{n-1}, \ldots, a_4, x_3, \ldots, x_0)$) except the constants zero and (N−1), where i=0, 1, ..., m−1 and each of the terms $a_{n-1}, \ldots, a_k$ equals zero or 1.

A set G is defined as the union of all sets $F_{a_{n-1}, \ldots, a_4}$.

The circuit for the function system $\text{fun}_{4,u}$, where u equals each value of tab($f_i$) from G, is constructed as described above with reference to formula (16) for the case where 8<N<=16. The depth of this circuit is 4.

Next, a circuit for the decoder D $(x_{n-1}, \ldots, x_4)$ is constructed as described above to generate the intermediate functions $\text{fun}_{1,1<<a_{n-1}} \wedge \text{fun}_{1,1<<a_{n-2}} \wedge \ldots \wedge \text{fun}_{1,1<<a_0}$. The decoder $D(x_{n-1}, \ldots, x_4)$ has a depth of at most 4, because n<=uplog(1M)−4=20−4=16 and depth(N)=uplog(N)=4.

A fifth logic layer includes the intermediate functions:

$$\text{fun}_{1,1<<a_{n-1}} \wedge \text{fun}_{1,1<<a_{n-2}} \wedge \ldots \wedge \text{fun}_{1,1<<a_0} \wedge f_i(a_{n-1}, \ldots, a_4, x_3, x_2, x_1, x_0) \qquad (20)$$

where i=0, 1, ..., m−1 and the terms $a_{n-1}, \ldots, a_0$ are each zero or one.

For each sequence $(a_{n-1}, \ldots, a_k)$ and sub-function u from the set $F_{a_{n-1}, \ldots, a_k}$, a logic cell to generate the intermediate function $f_{k_u}$ is instantiated. For the example where k=4, $$f_{4_u} = \text{fun}_{1,1<<a_{n-1}} \wedge \text{fun}_{1,1<<a_{n-2}} \wedge \ldots \wedge \text{fun}_{1,1<<a_0} \wedge \text{fun}_{4_u} \qquad (21)$$

where u=tab($f_i$). The functions in formula (21) are those constructed in formula (20).

A sub-function u from the set $F_{a_{n-1}, \ldots, a_5}$ and functions u0 and u1 from the set $F_{a_{n-1}, \ldots, a_4}$ are selected such that u=u0+(u1<<($2^k$)), where u=tab($f_i$). Then $$f_{5_u} = f_{4_{u0}} \wedge f_{4_{u1}} \qquad (22)$$

The functions $f_{5_u}$ and u from $F_{a_{n-1}, \ldots, a_4}$ are in the fifth logic layer. In general, additional layers of cells may be instantiated wherein each of the cells has only two inputs, and the two inputs are coupled respectively to two intermediate functions $f_{k_u}$ in the previous layer to generate each i-th output of an intermediate function $f_{k+1_u}$. Any function $f_i$ of the input function is an OR function of two functions according to the formula:

$$f_i = f_{(n-1)_{u0}} \wedge f_{(n-1)_{u1}} \qquad (23)$$

The depth of the circuit required to implement the input function is (n+1).

The embodiments of the present invention described above may be used to compile tables more efficiently than ROM for tables having fewer than a million entries. In contrast to some circuits that may be applicable to Boolean functions having a single number of input variables, such as four or five, or a narrow range of numbers of input variables, such as from four to eight, the embodiments of the present invention described above may be used with Boolean functions of a number of input variables wherein the number of input variables may vary over a range from $2^1$ to $2^{20}$.

While the invention herein disclosed has been described by means of specific embodiments and applications thereof, numerous modifications and variations could be made thereto by those skilled in the art without departing from the scope of the invention set forth in the following claims.

What is claimed is:

1. A method of constructing a circuit for a Boolean function comprising:
   receiving as input a Boolean function of a number n of input variables wherein the number n of input variables may be varied over a range;
   generating at least two intermediate functions comprising sub-functions of the Boolean function wherein zero or one is substituted for all but two of the number n of input variables; and
   generating a selected output of the Boolean function of the number n of input variables from only two of the intermediate functions wherein the number n of input variables may be varied over a range from $2^2$ to $2^{20}$.

2. A method of constructing a circuit for a Boolean function comprising:
   receiving as input a Boolean function of a number n of input variables wherein the number n of input variables may be varied over a range;
   generating at least two intermediate functions comprising sub-functions of the Boolean function wherein zero or one is substituted for all but two of the number n of input variables; and
   generating a selected output of the Boolean function of the number n of input variables from only two of the intermediate functions wherein the number n of input variables may be varied over a range from two to twenty.

3. A method of constructing a circuit for a Boolean function comprising:
   receiving as input a Boolean function of a number n of input variables wherein the number n of input variables may be varied over a range;
   generating at least two intermediate functions comprising sub-functions of the Boolean function wherein zero or one is substituted for all but two of the number n of input variables; and
   generating a selected output of the Boolean function of the number n of input variables from only two of the intermediate functions further comprising:
   instantiating a first layer of cells wherein each of the cells has only two inputs, and the two inputs are coupled respectively to first and second input variables $x_0$ and $x_1$ of the Boolean function to generate sub-functions $\text{fun}_{2,u}(x_1, x_0)$ each having an output vector equal to u wherein u is an integer corresponding to a binary representation of an i-th output $f_i(a, x_1, x_0)$ of the Boolean function and a equals zero or one;
   instantiating a second layer of cells wherein each of the cells has only two inputs, and the two inputs are coupled respectively to the i-th output of one of the sub-functions $\text{fun}_{2,u}(x_1, x_0)$ in the first layer and to a third input variable of the Boolean function to generate an AND-function of the third input variable and the i-th output; and
   instantiating a third layer of cells wherein each of the cells has only two inputs, and the two inputs are coupled respectively to two AND-functions generated by the cells in the second layer to generate an OR-function that is representative of the i-th output of the Boolean function of the number of input variables.

4. A method of constructing a circuit for a Boolean function comprising:

receiving as input a Boolean function of a number n of input variables wherein the number n of input variables may be varied over a range;

generating at least two intermediate functions comprising sub-functions of the Boolean function wherein zero or one is substituted for all but two of the number n of input variables; and generating a selected output of the Boolean function of the number n of input variables from only two of the intermediate functions further comprising:

instantiating a first layer of cells wherein each of the cells has only two inputs, and the two inputs are coupled respectively either to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a, b, x_1, x_0)$ of the Boolean function wherein $\{a, b\}$ equals one of $\{0, 0\}$, $\{0, 1\}$, $\{1, 0\}$, and $\{1, 1\}$ or to second and third input variables $x_2$ and $x_3$ of the Boolean function to generate sub-functions $K_{a,b} = fun_{2,1<<(2a+b)}(x_3, x_2)$;

instantiating a second layer of cells wherein each of the cells has only two inputs, and the two inputs are coupled respectively to an i-th output of one of the sub-functions $fun_{2,u}(x_1, x_0)$ in the first layer and to one of the sub-functions $K_{a,b} = fun_{2,1<<(2a+b)}(x_3, x_2)$ in the first layer to generate an intermediate function $f_{2_{a,b,u}}$ for each of the cells in the second layer;

instantiating a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein $u0 = u \% 16$ and $u1 = u >> 4$; and instantiating a fourth layer of cells wherein each of the cells has only two inputs, and the two inputs are coupled respectively to two intermediate functions $f_{3_{a,u2}}$ and $f_{3_{a,u3}}$ in the third layer to generate the i-th output of the Boolean function of the number of input variables wherein $u2 = u \% 256$ and $u3 = u >> 8$.

5. A method of constructing a circuit for a Boolean function comprising:

receiving as input a Boolean function of a number n of input variables wherein the number n of input variables may be varied over a range;

generating at least two intermediate functions comprising sub-functions of the Boolean function wherein zero or one is substituted for all but two of the number n of input variables; and generating a selected output of the Boolean function of the number n of input variables from only two of the intermediate functions further comprising:

instantiating a first layer of cells wherein each of the cells has only two inputs, and the two inputs are coupled respectively either to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a_{n-1}, \ldots, a_2, x_1, x_0)$ of the Boolean function wherein $a_{n-1}, \ldots, a_2$ is a binary representation of each number in the range from zero to $2^{n-2}-1$, or to second and third input variables $x_2$ and $x_3$ of the Boolean function to generate sub-functions $K_{a_{n-1}, \ldots, a_2} = fun_{1,1<<(1-a_{n-1})}(x_3, x_2) \wedge \ldots \wedge fun_{1,1<<(1-a_4)}(x_3, x_2)$;

instantiating a second layer of cells wherein each of the cells has only two inputs, and the two inputs are coupled respectively to an i-th output of one of the sub-functions $fun_{2,u}(x_1, x_0)$ in the first layer and to one of the sub-functions $K_{a_{n-1}, \ldots, a_2}$ in the first layer to generate an intermediate function $f_{2_{a,b,u}}$ for each of the cells in the second layer;

instantiating a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein $u0 = u \% 16$ and $u1 = u >> 4$;

instantiating a fourth layer of cells wherein each of the cells has only two inputs, and the two inputs are coupled respectively to two intermediate functions $f_{3_{a,u2}}$ and $f_{3_{a,u3}}$ in the third layer to generate each i-th output of an intermediate function $fun_{4,u}(x_3, x_2, x_1, x_0)$ wherein $u2 = u \% 256$ and $u3 = u >> 8$; and instantiating a fifth layer of cells wherein each of the cells has only two inputs coupled respectively to an i-th output of a decoder function $fun_{1,1<<(1-a_{n-1})}(x_{n-1}) \wedge \ldots \wedge fun_{1,1<<(1-a_0)}(x_0)$ wherein $a_{n-1}, \ldots, a_0$ is a binary representation of each number in the range from zero to $2^n-1$ and to the i-th output of a sub-function $fun_{4,u}(x_3, x_2, x_1, x_0)$ to generate an intermediate function $f_{4_u}$.

6. The method of claim 5 wherein the intermediate function $f_{4_u}$ corresponds to the i-th output of the Boolean function of the number of input variables.

7. The method of claim 5 comprising instantiating an additional layer of cells wherein each of the cells has only two inputs, and the two inputs are coupled respectively to two intermediate functions $f_{k_u}$ in the previous layer to generate each i-th output of an intermediate function $f_{k+1_u}$.

8. The method of claim 7 wherein the intermediate function $f_{k+1_u}$ corresponds to the i-th output of the Boolean function of the number of input variables.

9. A circuit for a Boolean function of a number n of input variables comprising:

a first layer of cells wherein each of the cells has only two inputs, and the two inputs are coupled respectively to first and second input variables $x_0$ and $x_1$ of the Boolean function to generate sub-functions $fun_{2,u}(x_1, x_0)$ each having an output vector equal to u wherein u is an integer corresponding to a binary representation of an i-th output $f_i(a, x_1, x_0)$ of the Boolean function and a equals zero or one;

a second layer of cells wherein each of the cells has only two inputs, and the two inputs are coupled respectively to the i-th output of one of the sub-functions $fun_{2,u}(x_1, x_0)$ in the first layer and to a third input variable of the Boolean function to generate an AND-function of the third input variable and the i-th output; and a third layer of cells wherein each of the cells has only two inputs, and the two inputs are coupled respectively to two AND-functions generated by the cells in the second layer to generate an OR-function that is representative of the i-th output of the Boolean function of the number of input variables.

10. A circuit for a Boolean function of a number n of input variables comprising:

a first layer of cells wherein each of the cells has only two inputs, and the two inputs are coupled respectively either to first and second input variables $x_0$ and $x_1$ of the Boolean function to generate sub-functions $\text{fun}_{2,u}(x_1, x_0)$ each having an output vector equal to u wherein u is an integer corresponding to a binary representation of an i-th output $f_i(a, b, x_1, x_0)$ of the Boolean function wherein $\{a, b\}$ equals one of $\{0, 0\}$, $\{0, 1\}$, $\{1, 0\}$, and $\{1, 1\}$ or to second and third input variables $x_2$ and $x_3$ of the Boolean function to generate sub-functions $K_{a,b} = \text{fun}_{2, 1 << (2a+b)}(x_3, x_2)$;

a second layer of cells wherein each of the cells has only two inputs, and the two inputs are coupled respectively to an i-th output of one of the sub-functions $\text{fun}_{2,u}(x_1, x_0)$ in the first layer and to one of the sub-functions $K_{a,b} = \text{fun}_{2, 1 << (2a+b)}(x_3, x_2)$ in the first layer to generate an intermediate function $f_{2_{a,b,u}}$ for each of the cells in the second layer;

a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein $u0 = u \% 16$ and $u1 = u >> 4$; and a fourth layer of cells wherein each of the cells has only two inputs, and the two inputs are coupled respectively to two intermediate functions $f_{3_{a,u2}}$ and $f_{3_{a,u3}}$ in the third layer to generate the i-th output of the Boolean function of the number of input variables wherein $u2 = u \% 256$ and $u3 = u >> 8$.

11. A circuit for a Boolean function of a number n of input variables comprising:

a first layer of cells wherein each of the cells has only two inputs, and the two inputs are coupled respectively either to first and second input variables $x_0$ and $x_1$ of the Boolean function to generate sub-functions $\text{fun}_{2,u}(x_1, x_0)$ each having an output vector equal to u wherein u is an integer corresponding to a binary representation of an i-th output $f_i(a_{n-1}, \ldots, a_2, x_1, x_0)$ of the Boolean function wherein $a_{n-1}, \ldots, a_2$ is a binary representation of each number in the range from zero to $2^{n-2} - 1$, or to second and third input variables $x_2$ and $x_3$ of the Boolean function to generate sub-functions $K_{a_{n-1}, \ldots, a_2} = \text{fun}_{1, 1 << (1-a_{n-1})}(x_3, x_2) \char`^ \ldots \char`^ \text{fun}_{1, 1 << (1-a_4)}(x_3, x_2)$;

a second layer of cells wherein each of the cells has only two inputs, and the two inputs are coupled respectively to an i-th output of one of the sub-functions $\text{fun}_{2,u}(x_1, x_0)$ in the first layer and to one of the sub-functions $K_{a_{n-1}, \ldots, a_2}$ in the first layer to generate an intermediate function $f_{2_{a,b,u}}$ for each of the cells in the second layer;

a third layer of cells wherein each of the cells has only two inputs, and the two inputs are coupled respectively to two intermediate functions $f_{2_{a,b,u0}}$ and $f_{2_{a,b,u1}}$ in the second layer to generate an intermediate function $f_{3_{a,u}}$ in the third layer wherein $u0 = u \% 16$ and $u1 = u >> 4$;

a fourth layer of cells wherein each of the cells has only two inputs, and the two inputs are coupled respectively to two intermediate functions $f_{3_{a,u2}}$ and $f_{3_{a,u3}}$ in the third layer to generate each i-th output of an intermediate function $\text{fun}_{4,u}(x_3, x_2, x_1, x_0)$ wherein $u2 = u \% 256$ and $u3 = u >> 8$; and a fifth layer of cells wherein each of the cells has only two inputs coupled respectively to an i-th output of a decoder function $\text{fun}_{1, 1 << (1-a_{n-1})}(x_{n-1}) \char`^ \ldots \char`^ \text{fun}_{1, 1 << (1-a_0)}(x_0)$ wherein $a_{n-1}, \ldots, a_0$ is a binary representation of each number in the range from zero to $2^n - 1$ and to the i-th output of a sub-function $\text{fun}_{4,u}(x_3, x_2, x_1, x_0)$ to generate an intermediate function $f_{4_u}$.

12. The circuit of claim 11 wherein the intermediate function $f_{4_u}$ corresponds to the i-th output of the Boolean function of the number n of input variables.

13. The circuit of claim 11 comprising an additional layer of cells wherein each of the cells has only two inputs, and the two inputs are coupled respectively to two intermediate functions $f_{k_u}$ in the previous layer to generate each i-th output of an intermediate function $f_{k+1_u}$.

14. The circuit of claim 13 wherein the intermediate function $f_{k+1_u}$ corresponds to the i-th output of the Boolean function of the number of input variables.

* * * * *